(12) United States Patent
Irizumi

(10) Patent No.: US 6,784,117 B2
(45) Date of Patent: Aug. 31, 2004

(54) METHOD FOR MANUFACTURING A SEMICONDUCTOR DEVICE

(75) Inventor: Tomoyuki Irizumi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/278,949

(22) Filed: Oct. 24, 2002

(65) Prior Publication Data

US 2003/0216055 A1 Nov. 20, 2003

(30) Foreign Application Priority Data

May 20, 2002 (JP) ........................................ 2002-144925

(51) Int. Cl.$^7$ .............................................. H01L 21/31
(52) U.S. Cl. ........................................ 438/778; 438/680
(58) Field of Search ........................ 438/680, 778–783, 438/623

(56) References Cited

U.S. PATENT DOCUMENTS 5,532,191 A * 7/1996 Nakano et al. ............. 438/692
6,221,755 B1 * 4/2001 Tokumasu et al. .......... 438/623
2001/0051424 A1 * 12/2001 Lin et al. .................... 438/632

FOREIGN PATENT DOCUMENTS

JP          8-31814     2/1996
JP          11-260750   9/1999

* cited by examiner

Primary Examiner—Dung A. Le
(74) Attorney, Agent, or Firm—Burns, Doane, Swecker & Mathis, L.L.P.

(57) ABSTRACT

In a method for manufacturing a semiconductor device having a USG film 5 formed on a semiconductor substrate 1 in which an N+-type active region 2 and a P+-type active region 3 are formed, an oxide film 4 is formed on the semiconductor substrate 1 and the USG film 5 is formed on the oxide film 4. Because the influence of the characteristic difference of an underlying layer on the formation of the USG film 5 can be avoided due to the existence of the oxide film, the USG film 5 can be formed in a uniform thickness over regions including the semiconductor substrate 1, the P+-type active region 3 and the N+-type active region 2.

10 Claims, 5 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device, and more particularly, to a method for manufacturing a semiconductor device wherein a USG film is formed on a semiconductor substrate in which an impurity region of a first conduction type and an impurity region of a second conduction type formed.

2. Background Art

Now, progress has been made in the further multi-layer formation technique for wiring structures and also in the reduction in space between adjacent wiring layers, both attended with the advancing scale down of semiconductor devices of a high degree of integration, with the tendency that differences in steps on the surface of semiconductor devices become greater. A greater step difference reflects on a greater difference in step of an interlayer insulating film, thus bringing about the problem that upon formation of wiring layers, for example, a processing accuracy lowers, thereby lowering a yield of product. Accordingly, there is a demand for a technique of flattening an interlayer insulating film.

For an interlayer insulating film which is able to be flattened, there is known a USG (undoped silicate glass) film that is formed by thermal reaction between tetraethyl orthosilicate ($Si(OC_2H_5)_4$, hereinafter referred to as TEOS) and ozone ($O_3$). Attention has now been paid to this film as a material capable of forming a well-flattened surface because of the reflow of an intermediate product being heated.

However, the USG film has such a nature that its growing rate differs depending on the characteristics of an underlying layer (such a nature being hereinafter referred to as underlying layer dependence). FIG. 7 is a sectional view showing the case where a USG film 16 is formed on a silicon substrate 15 having a region activated as an N+-type (hereinafter referred to as N+-type active region) 13 and a region activated as a P+-type (hereinafter referred to as P+-type active region) 14. In the instance of the figure, the surface of the silicon substrate 15 on which the USG film is formed is flat. Nevertheless, the surface of the USG film 16 formed on this flat silicon substrate 15 is not flat, with a difference t in thickness being observed partly. This is described in detail.

As shown in FIG. 7, the thickness of the USG film on the P+-type active region 14 and the silicon substrate 15 is uniform, thereby forming a fiat surface. However, the USG film formed on the N+-type active region has a thickness smaller than that formed on the P+-type active region 14 and the silicon substrate 15. More particularly, the thickness difference t is created between the USG film portions 16a, 16b on the P+-type active region 14 and the silicon substrate 15 and the USG film portion 16c on the N+-type active region 13, so that although the underlying semiconductor substrate 15 is formed as flat, the surface of the USG film is not flat. When such a thickness difference is established and the thickness of the USG film portion on the N+-type active region 13 becomes smaller, a problem arises in that when the USG film is etched, for example, in a subsequent step, overetching takes place only at the N+-type active region 13, thereby causing a variation in resistance of the resultant transistor.

SUMMARY OF THE INVENTION

The invention has been made in order to overcome the above-stated problems. More particularly, the invention has for its object the provision of a method for manufacturing a semiconductor device wherein a USG film can be formed while reducing the underlying layer dependence.

According to one aspect of the present invention, in a method for manufacturing a semiconductor device wherein a USG film is formed over a semiconductor substrate that has an impurity region of a first conduction type and an impurity region of a second conduction type formed therein, an oxide film is formed on a surface of the semiconductor substrate. The USG film is formed on the oxide film.

According to another aspect of the present invention, in a method for manufacturing a semiconductor device wherein a USG film is formed on a semiconductor substrate that has an impurity region of a first conduction type and an impurity region of a second conduction type formed therein, the USG film is formed by a chemical vapor deposition method at a pressure lower than 30 Torr.

According to another aspect of the present invention, in a method for manufacturing a semiconductor device wherein a USG film is formed on a semiconductor substrate that has an impurity region of a first conduction type and an impurity region of a second conduction type formed therein, the USG film includes a first USG film and a second USG film formed on the first USG film. The first USG film is formed by a chemical vapor deposition method at a pressure lower than 30 Torr. The second USG film is formed by a chemical vapor deposition method at a pressure of 100 Torr to 600 Torr.

According to another aspect of the present invention, in a method for manufacturing a semiconductor device wherein a USG film is formed over a semiconductor substrate that has an impurity region of a first conduction type and an impurity region of a second conduction type formed therein, an insulating film, selected from the group consisting of a BSG film, a PSG film and a BPSG film, is formed on the semiconductor substrate.

Other and further objects, features and advantages of the invention will appear more fully from the following description.

DETAILED DESCRIPTION OF THE PREFERRED EMBODIMENTS

The embodiments of the invention will be described in detail with reference to the accompanying drawings.

First Embodiment

Figure 1:
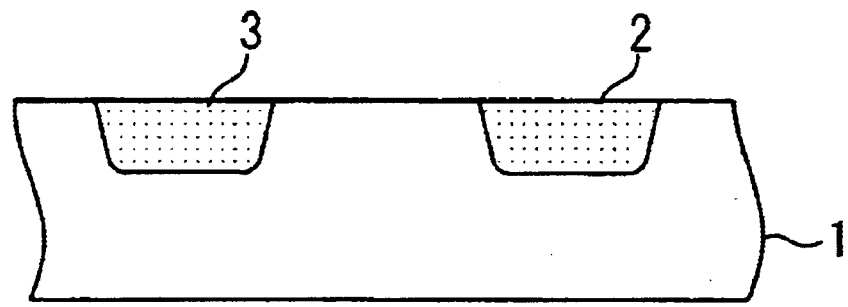
FIG. 1(a) is a sectional view of a semiconductor device according to a first embodiment of the invention.
FIG. 1(b) is a sectional view of a semiconductor device according to a first embodiment of the invention.
FIG. 1(c) is a sectional view of a semiconductor device according to a first embodiment of the invention.
Figure 1:
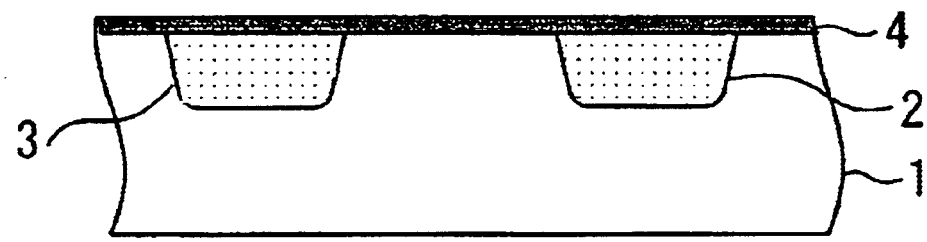
Figure 1:
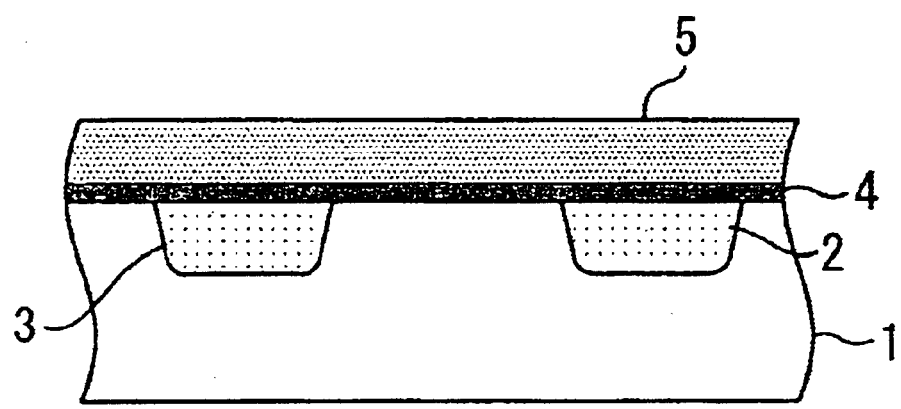

Referring now to FIG. 1, the method of forming a USG film according to this embodiment is illustrated. As shown in FIG. 1(a), an impurity region of a first conduction type and an impurity region of a second conduction type are formed on a semiconductor substrate 1. For instance, a silicon substrate is provided as the semiconductor substrate 1, followed by implanting $1 \times 10^{13}$ ions/cm$^2$ of phosphorus (P) at an energy of 40 keV and $4 \times 10^{15}$ ions/cm$^2$ of arsenic (As) at an energy of 50 keV by an ion implantation method, thereby forming an N+-type active region 2. Next, boron (B) is implanted at $1 \times 10^{13}$ ions/cm$^2$ at an energy of 15 keV and boron difluoride (BF$_2$) is implanted at $3 \times 10^{15}$ ions/cm$^2$ at an energy of 20 keV, thereby forming a P+-type active region 3.

Next, an oxide film 4 is formed on the surface of the semiconductor substrate 1 to provide a structure of FIG. 1(b). The oxide film is formed, for example, by placing the semiconductor substrate 1 within an oxidation furnace heated to a given temperature and heating the semiconductor substrate 1 in an atmosphere of oxygen. The thickness of the oxide film 4 should preferably range 50 Å to 200 Å. For example, when the silicon substrate is placed in an oxidation furnace heated to 950° C. and is thermally treated in an atmosphere of oxygen at a flow rate of $15.8 \times 10^{-5}$ m$^3$/s (9.5 slm) for 30 sec, the surface of the silicon substrate is oxidized to form an about 100 Å thick silicon oxide film (SiO$_2$).

The oxide film 4 may be formed directly on the semiconductor substrate 1 by a chemical vapor deposition method (hereinafter referred to as CVD method). For instance, a silicon substrate is placed in a film-forming apparatus based on the CVD method, into which TEOS and oxygen (O$_2$) are introduced as starting gases to form a silicon oxide film on the surface of the silicon substrate.

Next, as shown in FIG. 1(c), a USG film 5 is formed on the semiconductor substrate 1 on which the oxide film 4 has been formed. More particularly, according to a CVD method using, as starting gases, TEOS and ozone, the USG film 5 is formed. For instance, the semiconductor substrate 1 is placed in a film-forming batch of a film-forming apparatus (not shown) based on the CVD method and heated to a given temperature, followed by feeding an oxygen gas containing an ozone gas into the film-forming batch at a given flow rate. Moreover, liquid TEOS is gasified by an injection method and fed into the film-forming batch at a given flow rate by use of a helium gas (He) as a carrier gas. The TEOS and the ozone are reacted with each other in the film-forming batch to form a USG film. For the carrier gas, a nitrogen (N$_2$) gas mixed with a helium gas may be used. The film formation is continued over a given time to obtain the USG film 5 having a desired thickness.

The embodiment is characterized in that the USG film 5 is not formed directly on the surface of the semiconductor substrate 1 in which the P+-type active region 3 and the N+-type active region 2 have been formed, but is formed through the oxide film 4. Accordingly, the influence of the characteristic difference of the underlying layer on the formation of the USG film 5 can be avoided due to the existence of the oxide film 4. Accordingly, as shown in FIG. 1(c), the USG film 5 having a uniform thickness can be formed throughout the regions including the semiconductor substrate 1, the P+-type active region 3 and the N+-type active region 2.

Second Embodiment

This embodiment is characterized in that a pressure under which the USG film is formed is lower than in prior art cases.

Figure 7:
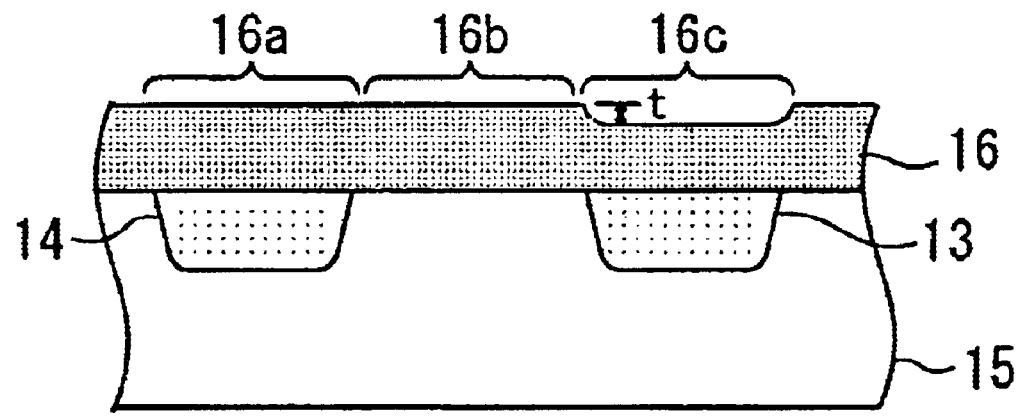
FIG. 7 is a sectional view of a conventional semiconductor device.

The arrangement of a semiconductor device according to the embodiment is similar to a known counterpart as shown in FIG. 7, in which a USG film is formed directly on a semiconductor substrate having an impurity region of a first conduction type and an impurity region of a second conduction type formed therein.

Like the first embodiment, an impurity region of a first conduction type and an impurity region of a second conduction type are formed in a semiconductor substrate. For instance, a silicon substrate is provided as a semiconductor substrate, in which an N+-type active region is formed by implanting phosphorus (P) at $1 \times 10^{13}$ ions/cm$^2$ at an energy of 40 keV and arsenic (As) at $4 \times 10^{15}$ ions/cm$^2$ at an energy of 50 keV. Next, boron (B) is implanted at $1 \times 10^{13}$ ions/cm$^2$ at an energy of 15 keV and boron difluoride (BF$_2$) is implanted at $3 \times 10^{15}$ ions/cm$^2$ at an energy of 20 keV to form a P+-type active region.

Further, a USG film is formed on the semiconductor substrate. More particularly, TEOS and ozone are used as starting gases and the film is formed by a CVD method. For instance, a semiconductor substrate is placed in a film-forming batch of a film-forming device based on a CVD method and heated to a given temperature, followed by feeding an oxygen gas containing an ozone gas into the film-forming batch at a given flow rate. Moreover, liquid TEOS is gasified by an injection method and fed into the film-forming batch at a given flow rate by use of a helium gas (He) as a carrier gas. For the carrier gas, a nitrogen (N$_2$) gas mixed with a helium gas may also be used. Subsequently, the film formation is continued over a given time to obtain the USG film 5 having a desired thickness.

Figure 2:
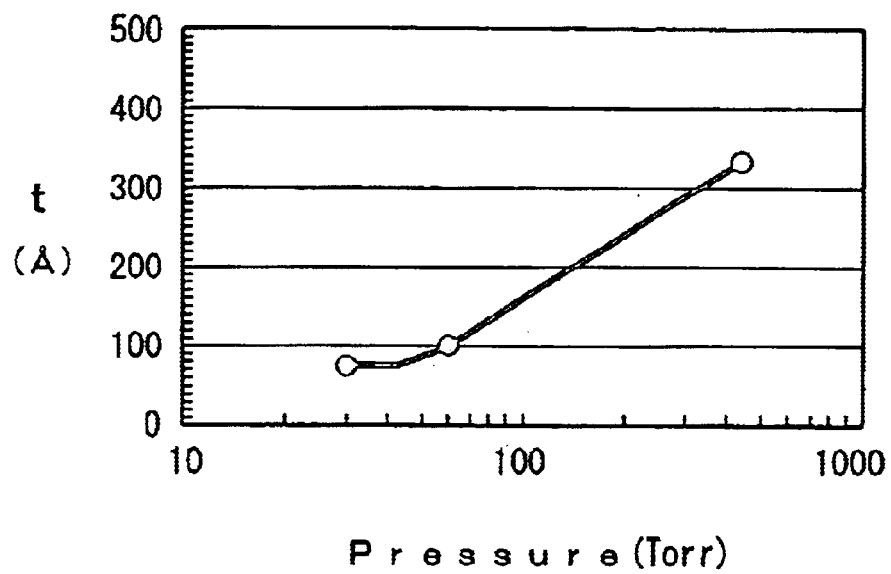
FIG. 2 shows the change in difference of the thickness t in relation to the USG film-forming pressure.

FIG. 2 shows the change in difference of thickness t in relation to the USG film-forming pressure in the case where the semiconductor substrate ion implanted according to the above instance is used. The conditions other than the film-forming pressure are indicated in Table 1. It will be noted that in Table 1, helium and a nitrogen gas are mixed at 1:2 and are used as a carrier gas.

TABLE 1

| | |
|---|---|
| Film-forming temperature | 400° C. |
| Flow rate of TEOS | 1200 mg/min |
| Flow rate of He | $6.7 \times 10^{-5}$ m$^3$/s (4 slm) |
| Flow rate of N$_2$ | $13.4 \times 10^{-5}$ m$^3$/s (8 slm) |
| Flow rate of O$_2$ | $13.4 \times 10^{-5}$ m$^3$/s (8 slm) |
| Concentration of O$_3$ | 12.5 wt % |

In FIG. 2, the thickness difference t indicates a difference in thickness of a USG film between the P+-type active region and the N+-type active region when the USG film is formed on the P+-type active region in a thickness of 1000 Å. In the instance of FIG. 2, when the film-forming pressure is at 450 Torr, the thickness difference of the USG film is such that t=330 Å. In this case, since the thickness of the USG film is 1000 Å on the P+-type active region, the thickness on the N+-type active region is at 670 Å. Likewise, when the film-forming pressure is at 30 Torr, the thickness difference of the USG film is at t=70 Å. In the case, since the thickness of the USG film is 1000 Å on the P+-type active region, the thickness on the N+-type active region is at 930 Å.

From FIG. 2, it will be seen that a greater film-forming pressure results in a greater difference in thickness. Accordingly, in order to flatten the surface of the USG film while reducing the thickness difference, this embodiment is characterized in that the USG film is formed at a low pressure, particularly, at a pressure not higher than 30 Torr.

Where the film formation is effected at a pressure of 30 Torr or below, the thickness difference of the USG film can be suppressed to 70 Å or below. This difference permits the problem on the variation of resistance caused by overetching in a subsequent step to be solved.

Third Embodiment

This embodiment is characterized in that a pressure is changed upon formation of a USG film.

The arrangement of a semiconductor device according to the embodiment is similar to that of the prior art shown in FIG. 7, and a USG film is formed directly on a semiconductor substrate in which an impurity region of a first conduction type and an impurity region of a second conduction type have been formed.

Like the first embodiment, an impurity region of a first conduction type and an impurity region of a second conduction type are formed on a semiconductor substrate. For instance, a silicon substrate is provided as the semiconductor substrate, followed by implanting $1\times10^{13}$ ions/cm$^2$ of phosphorus (P) at an energy of 40 keV and $4\times10^{15}$ ions/cm$^2$ of arsenic (As) at an energy of 50 keV by an ion implantation method, thereby forming an N+-type active region. Next, boron (B) is implanted at $1\times10^{13}$ ions/cm$^2$ at an energy of 15 keV and boron difluoride (BF$_2$) is implanted at $3\times10^{15}$ ions/cm$^2$ at an energy of 20 keV, thereby forming a P+-type active region.

Next, a USG film is formed on the semiconductor substrate. For the formation of the USG film, a CVD method is carried out using TEOS and ozone as starting gases. For instance, a semiconductor substrate is placed in a film-forming batch of a film-forming apparatus based on the CVD method and heated to a given temperature, followed by feeding an oxygen gas containing an ozone gas into the film-forming batch at a given flow rate. Moreover, liquid TEOS is gasified by an injection method and fed into the film-forming batch at a given flow rate by use of a helium gas (He) as a carrier gas. For the carrier gas, a nitrogen (N$_2$) gas mixed with a helium gas may also be used. The film formation is continued over a given time to obtain the USG film having a desired thickness.

Figure 3:
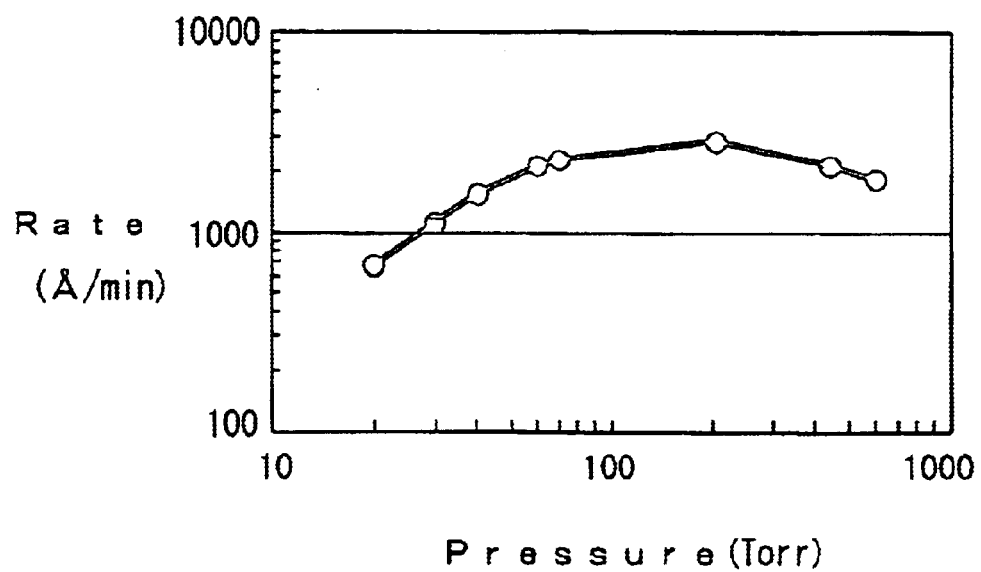
FIG. 3 shows the change in film-forming rate in relation to the USG film-forming pressure.

FIG. 3 shows the change in film-forming rate in relation to the film-forming pressure of the USG film. It will be seen that up to a film-forming pressure of 200 Torr, a higher pressure results in a greater film-forming rate. As stated in the second embodiment, the thickness difference can be made smaller at a smaller film-forming pressure. In view of the relationship of FIG. 3, however, a smaller film-forming pressure leads to a lower film-forming rate, with the attendant problem that the throughput lowers. To avoid this, this embodiment is characterized in that the USG film is formed broadly by two stages. More specifically, a first USG film is initially formed at a pressure ensuring a small difference in thickness. The thickness of the first USG film should be one which is so small as not to present the problem of underlying layer dependence in a subsequent step when a second USG film is formed and which allows film formation within a time not lowering a total throughput significantly. Preferably, the thickness ranges 50 Å to 200 Å. Next, in order to increase the throughput, the pressure is increased, under which a second USG film is formed. The underlying layer dependence of the second USG film is out of question due to the existence of the first USG film, so that the second USG film can be formed without causing a thickness difference if a film-forming pressure is made high. The thickness of the second USG film is determined such that a total thickness of the first USG film and the second USG film is equal to a desired thickness of the USG film as a whole.

Figure 4:
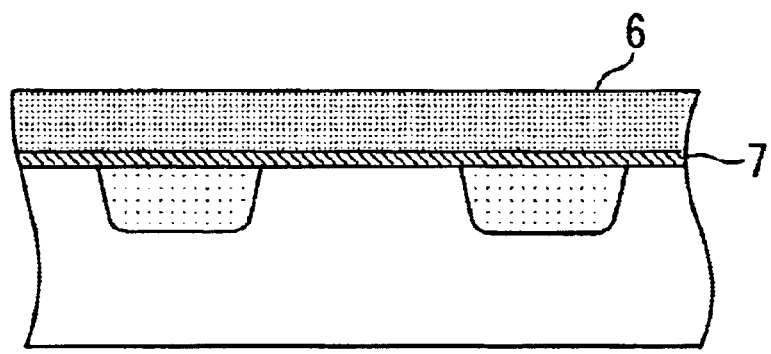
FIG. 4 is a sectional view of a semiconductor device according to a third embodiment of the invention.

For instance, where a preset thickness value of the USG film as a whole is at 1000 Å, the first film is formed in a thickness of 100 Å under conditions of a pressure of 30 Torr and a film-forming rate of 1100 Å/minute. Next, the second USG film is formed in a thickness of 900 Å under conditions of a pressure of 100 Torr to 600 Torr and a film-forming rate of 2000 Å/min to 3000 Å/min. As shown in FIG. 4, the second USG film 6 is formed on the first USG film 7, and if the pressure for the formation of the second USG film 6 is increased, any significant difference in the thickness of the second USG film 6 is not created.

According to this embodiment, the influence, which depends on the characteristics of an underlying layer, can be suppressed owing to the existence of the first USG film, and the lowering of a throughput can be made small. Moreover, since the USG films alone are formed on the semiconductor substrate, the change of material gases is unnecessary, thus the formation being simple.

Figure 5:
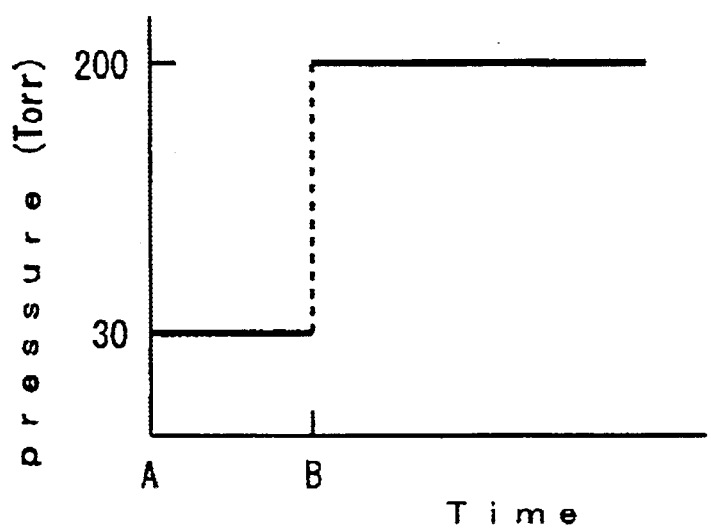
FIG. 5 shows an example of a pressure change relative to the film-forming time.

The first USG film and the second USG film may be formed continuously within the same film-forming apparatus. For instance, after formation of a first USG film at a pressure of 30 Torr at a film-forming rate of 1100 Å/min in a given time in a thickness of 100 Å, a second USG film is formed in a thickness of 900 Å while increasing the pressure to 100 Torr to 600 Torr to increase the film-forming rate (2000 Å/min to 3000 Å/min). FIG. 5 shows an example of a pressure change relative to the film-forming time. A first USG film is formed in such a state that the film-forming time is kept at 30 Torr over a film-forming time of from A to B. Next, the film-forming pressure is changed to 200 Torr, thereby forming a second USG film. The formation of the second USG film is continued until the total thickness of the first USG film and the second USG film reaches a desired value.

Fourth Embodiment

Figure 6A:
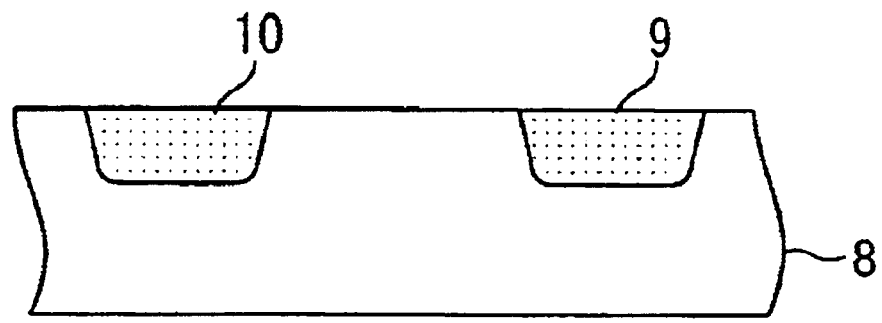
FIG. 6(a) is a sectional view of a semiconductor device according to a fourth embodiment of the invention.
Figure 6B:
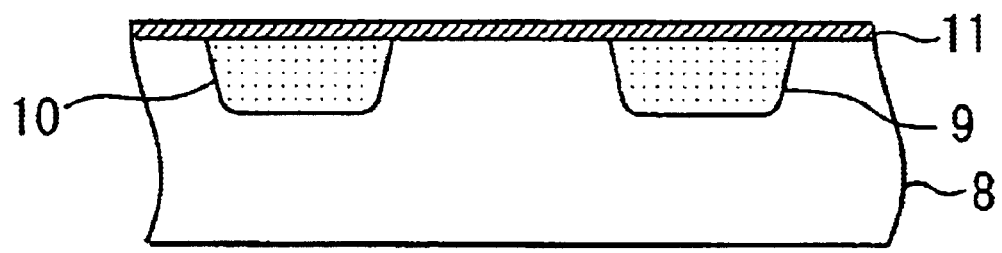
FIG. 6(b) is a sectional view of a semiconductor device according to a fourth embodiment of the invention.
Figure 6C:
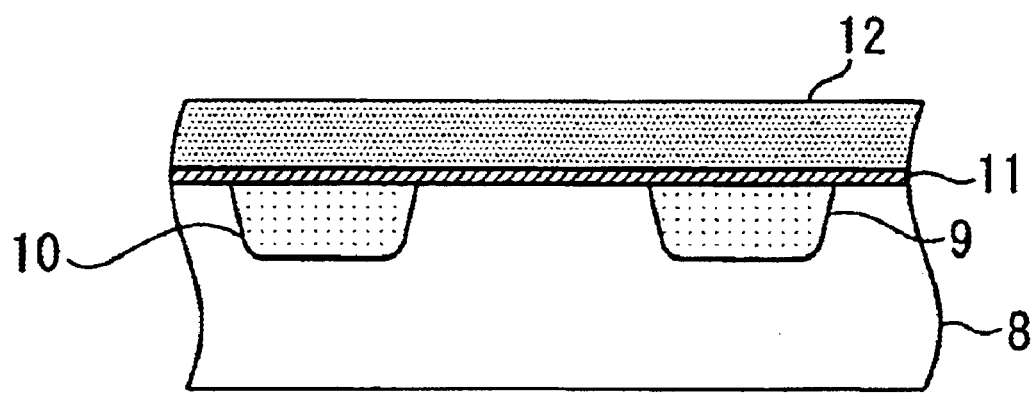
FIG. 6(c) is a sectional view of a semiconductor device according to a fourth embodiment of the invention.

Referring to FIG. 6, the method of forming a USG film according to this embodiment will be described. As shown in FIG. 6(a), an impurity region of a first conduction type and an impurity region of a second conduction type are formed on a semiconductor substrate 8. For instance, a silicon substrate is provided as the semiconductor substrate, and phosphorus (P) is implanted at an energy of 40 keV at $1\times10^{13}$ ions/cm$^2$ and arsenic (As) is implanted at an energy of 50 keV at $4\times10^{15}$ ions/cm$^2$, both according to an ion implantation method, thereby forming an N+-type active region 9. Next, boron (B) is implanted at an energy of 15 keV at $4\times10^{13}$ ions/cm$^2$ and boron disulfide (BF$_2$) is implanted at an energy of 20 keV at $3\times10^{15}$ ions/cm$^2$, thereby forming a P+-type active region 10.

Next, the semiconductor substrate 8 is placed in a CVD apparatus for USG film formation. For instance, the semiconductor substrate 8 is placed in a film-forming batch of the CVD apparatus, and a TEOS gas and an ozone gas are introduced into a film-forming chamber. In this embodiment, a small amount of an impurity, such as boron (B) or phosphorus (P), is added to the above gas, and an insulating film 11 selected from the group consisting of a BSG (borosilicate glass) film, a PSG (phosphosilicate glass) film and a BPSG (borophosphosilicate glass) film is formed on the semiconductor substrate 8. Subsequently, the addition of the impurity is stopped so as to form a USG film 12, thereby providing a structure of FIG. 6(c).

For example, where the BSG film is formed, a TMB (trimethylborate (B(OCH$_3$)$_3$)) gas is mixed with the mixed gas of TEOS and ozone. With the formation of the PSG film, a TMP (trimethylphosphite (P(OCH$_3$)$_3$)) gas or a TMOP (trimethylphosphate (PO(OCH$_3$)$_3$)) gas is mixed with the mixed gas of TEOS and ozone. Likewise, with the formation of the BPSG film, a TMB gas and a TMP gas or a TMOP gas is mixed with the mixed gas of TEOS and ozone. The amount of a gas, to which the mixed gas of TEOS and ozone is added, is such a very small amount as not influence the characteristics of the semiconductor device. Moreover, the thickness of the insulating film 11 (i.e. BSG film, PSG film or BPSG film) formed on the semiconductor substrate 8 should be one which is sufficient to lose the underlying layer dependence of the USG film 12. More particularly, the thickness of the insulating film 11 should preferably range 1 Å to 10 Å.

The USG film is formed according to the CVD method using TEOS and ozone as starting gases. For instance, the semiconductor substrate 8 is placed in a film-forming batch of a film-forming apparatus based on the CVD method and heated to a predetermined temperature, and an oxygen gas containing ozone is fed into the film-forming batch at a given flow rate. Further, Liquid TEOS is gasified by an injection method and fed into the film-forming batch at a given flow rate by use of a helium gas (He) as a carrier gas. The gas obtained by mixing a nitrogen ($N_2$) gas with a helium gas may be used as a carrier gas. Thereafter, film formation is continued over a given time to obtain the USG film having a desired thickness.

This embodiment is characterized in that the USG film is not formed directly on the surface of the semiconductor substrate having the P+-type active region and the N+-type active region formed therein, but is formed via an intermediate film such as a BSG film, a PSG film or a BPSG film. Thus, in this embodiment, the influence of the characteristic difference of an underlying layer on the formation of a USG film can be avoided. Accordingly, as shown in FIG. 6(*c*), a flat USG film having a uniform thickness can be formed on the insulating film 11 over regions including the semiconductor substrate 8, the N+-type active region 9 and the P+-type active region 10.

The features and advantages of the present invention may be summarized as follows.

According to one aspect, the influence of the characteristic difference of an underlying layer on the formation of the USG film can be avoided due to the existence of an oxide film. Accordingly, the USG film having a uniform thickness can be formed over regions including the semiconductor substrate, an impurity region of a first conduction type and an impurity region of a second conduction type.

According to another aspect, the difference in the thickness of the USG film depending on the difference in type of underlying layer is made small, thereby creating a flat surface.

According to another aspect, the influence of the characteristic difference of an underlying layer can be avoided due to the existence of the first USG film, and the lowering of throughput can be lessened.

According to another aspect, the influence of the characteristic difference of an underlying layer on the formation of the USG film can be lost. Accordingly, the USG film having a uniform thickness can be formed on an intermediate layer over regions including the semiconductor substrate, the first conduction-type impurity region and the second conduction-type impurity region.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-144925, filed on May 20, 2002 including specification, claims, drawings and summary, on which the Convention priority of the present application is based, are incorporated herein by reference in its entirety.

What is claimed is:

1. A method for manufacturing a semiconductor device wherein a USG film is formed on a semiconductor substrate that has an impurity region of a first conduction type and an impurity region of a second conduction type formed therein, said method comprising the steps of:

forming an oxide film on a surface of said semiconductor substrate; and forming said USG film on said oxide film.

2. A method for manufacturing a semiconductor device according to claim 1, wherein said oxide film has a thickness in a range of about 50 Å to about 200 Å.

3. A method for manufacturing a semiconductor device wherein a USG film is formed on a semiconductor substrate that has an impurity region of a first conduction type and an impurity region of a second conduction type formed therein, where said USG film is formed by a chemical vapor deposition method at a pressure lower than about 30 Torr.

4. A method for manufacturing a semiconductor device wherein a USG film is formed on a semiconductor substrate that has an impurity region of a first conduction type and an impurity region of a second conduction type formed therein, wherein said USG film includes a first USG film and a second USG film formed on said first USG film wherein said first USG film is formed by a chemical vapor deposition method at a pressure lower than about 30 Torr, and said second USG film is formed by a chemical vapor deposition method at a pressure of about 100 Torr to about 600 Torr.

5. A method for manufacturing a semiconductor device according to claim 4, wherein after the formation of said USG film, said second USG film is continuously formed.

6. A method for manufacturing a semiconductor device wherein a USG film is formed on a semiconductor substrate that has an impurity region of a first conduction type and an impurity region of a second conduction type formed therein, said method comprising the steps of:

forming, on said semiconductor substrate, an insulating film selected from the group consisting of a BSG film, a PSG film, and a BPSG film; and forming said USG film on said insulating film.

7. A method for manufacturing a semiconductor device according to claim 6, wherein said USG film is formed, continuously after the formation of said insulating film, by a chemical vapor deposition method using a reactive gas containing tetraethyl orthosilicate and ozone.

8. A method for manufacturing a semiconductor device according to claim 6, wherein said insulating film has a thickness in a range from about 1 Å to about 10 Å.

9. A method for manufacturing a semiconductor device according to claim 6, wherein said insulating film has a thickness sufficient to lose an underlying layer dependence of said USG film.

10. A method for manufacturing a semiconductor device wherein a USG film is formed on a semiconductor substrate that has an impurity region of a first conduction type and an impurity region of a second conduction type formed therein, wherein said USG film includes a first USG film and a second USG film formed on said first USG film wherein said first USG film is formed having a thickness sufficient to lose an underlying layer dependence of said second USG film, and said second USG film is formed having a thickness such that a total thickness of said first USG film and said second USG film is substantially equal to a desired thickness.

* * * * *